United States Patent
Sonoda

(10) Patent No.: US 6,198,135 B1
(45) Date of Patent: Mar. 6, 2001

(54) SEMICONDUCTOR DEVICE HAVING ELECTROSTATIC DISCHARGE PROTECTION ELEMENT AND MANUFACTURING METHOD THEREOF

(75) Inventor: Kenichiro Sonoda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/092,019

(22) Filed: Jun. 5, 1998

(30) Foreign Application Priority Data

Jan. 21, 1998 (JP) .................................. 10-009592

(51) Int. Cl.[7] .................................................. H01L 23/62
(52) U.S. Cl. .......................... 257/355; 257/192; 257/356; 257/360
(58) Field of Search .................................... 257/355, 356, 257/360, 20, 192

(56) References Cited

U.S. PATENT DOCUMENTS

| | | | |
|---|---|---|---|
| Re. 33,693 | * 9/1991 | Bean et al. ............................... | 257/20 |
| 4,509,067 | * 4/1985 | Minami et al. ........................ | 257/360 |
| 5,312,766 | * 5/1994 | Aronowitz et al. ...................... | 437/24 |
| 5,698,869 | * 12/1997 | Yoshimi et al. ........................ | 257/192 |
| 5,891,792 | * 4/1999 | Shih et al. ............................. | 257/263 |

FOREIGN PATENT DOCUMENTS 4-34942  2/1992 (JP) .

* cited by examiner

Primary Examiner—J. Carroll
(74) Attorney, Agent, or Firm—Oblon, Spivak, McClelland, Maier & Neustadt, P.C.

(57) ABSTRACT

A semiconductor device having an ESD protection element with an improved ESD resistance is obtainable even if it is formed on the same substrate together with an internal circuit. An SiGe—P well region (3) mainly composed of SiGe having a smaller breakdown field than Si, is formed in the upper portion of a P type Si substrate (1). A drain region (4) and a source region (5) are selectively formed in the surface of the SiGe—P well region (3), and therefore, the boundary between the SiGe—P well region (3) and the drain and source regions (4), (5) defines a PN junction. This results in a MOS transistor for protection comprising the SiGe—P well region (3), the drain region (4), the source region (5), a gate oxide film (6), and a gate polysilicon layer (7).

8 Claims, 13 Drawing Sheets

SEMICONDUCTOR DEVICE HAVING ELECTROSTATIC DISCHARGE PROTECTION ELEMENT AND MANUFACTURING METHOD THEREOF

BACKGROUND OF THE INVENTION

1. Field of the Invention

The present invention relates to the improvement of the semiconductor device having the electrostatic discharge (hereinafter referred to as "ESD") resistance of an ESD protection element that protect an internal circuit from the breakdown due to an ESD.

2. Description of the Background Art

An integrated circuit is usually provided with a protection circuit in order to protect an internal circuit from the breakdown due to ESDs, such as discharge of the charge from the exterior, and discharge of the charge charged to the integrated circuit. An ESD protection element that comprises an MOS transistor or a field transistor utilizing a local oxidation of silicon (hereinafter referred to as "LOCOS") oxide film is used as a protection circuit. Generally, one electrode of a transistor serving as an ESD protection element is connected an I/O terminal, and the other electrode is connected to a fixed potential setting terminal, e.g., a ground terminal.

FIG. 25 is a circuit diagram showing a connection example of an NMOS transistor for protection. As shown in FIG. 25, the drain of an NMOS transistor for protection Q1 is connected to an I/O terminal P1, and the source and gate are grounded. An internal circuit (not shown) for performing the actual operation is also connected to the I/O terminal P1.

When the normal voltage is applied to the I/O terminal P1, the NMOS transistor for protection Q1 is in OFF state, causing no influence on the internal circuit. On the other hand, when an ESD occurs and the surge voltage SV is applied to the I/O terminal P1, the PN junction between an N type drain region and a P type well region (substrate) results in breakdown to discharge the surge voltage from the I/O terminal P1 to a ground level (grounding terminal), thereby protecting the internal circuit.

A field transistor has the structure in which an LOCOS oxide film is provided in place of the gate section (i.e., the gate oxide film and gate electrode) of an MOS transistor. Therefore, such a field transistor does not maintain the original transistor structure, but it is called field transistor in the technical fields that deal with ESD. Hereinafter, the regions of a field transistor which correspond to the drain and source regions of an MOS transistor are also referred to as drain and source regions, respectively.

An N type field transistor for protection (whose drain and source regions are of the N type) having the above-mentioned structure may be connected in the same manner as in the NMOS transistor for protection Q1 shown in FIG. 25. However, no potential setting is required for a LOCOS oxide film.

Like the MOS transistor for protection, in the field transistor for protection, no current follows between the drain and source in the normal state, and when an ESD occurs, the PN junction between the N type drain region and the P type well region results in breakdown so that a surge voltage is discharged from an I/O terminal P1 to a ground level (grounding terminal), to protect an internal circuit.

That is, the breakdown of the PN junction of an ESD protection element in the occurrence of an ESD allows the surge voltage to be discharged through the ESD protection element, thereby protecting the internal circuit. In prior art, an ESD protection element has been formed together with an internal circuit on a single semiconductor substrate under the same conditions.

However, as the refinement of elements is advanced, the ESD resistance of an ESD protection element is lowered, and therefore, even if an ESD protection element is formed inside an integrated circuit, failing to protect the breakdown due to an ESD.

SUMMARY OF THE INVENTION

According to a first aspect of the present invention, a semiconductor device having an ESD protection element comprises: a semiconductor substrate of a first conductivity type mainly composed of a first material; a first semiconductor region of a second conductivity type, formed in a surface of the semiconductor substrate; a second semiconductor region formed in a surface of the semiconductor substrate, independently of the first semiconductor region, edge portions in the first and second semiconductor regions opposed to each other being defined as first and second edge regions, respectively; and a semiconductor region for ESD protection of the first conductivity type, formed in a region of the semiconductor substrate including at least a region in the vicinity of a junction with the first and second edge portions, the semiconductor region for ESD protection being mainly composed of a second material having a smaller breakdown field than the first material.

According to a second aspect, the semiconductor device having the ESD protection element of the first aspect further comprises: an insulting film on the semiconductor substrate between the first and second semiconductor regions; and a gate electrode on the insulating film.

According to a third aspect, the semiconductor device having the ESD protection element of the first aspect further comprises an isolated insulating region, some of which projects from the semiconductor substrate between the first and second semiconductor regions, and the rest is buried in a surface of the semiconductor substrate.

According to a fourth aspect, the semiconductor device having the ESD protection element of the first aspect is characterized in that the semiconductor region for ESD protection is selectively formed in an upper portion of the semiconductor substrate; and the first edge portion of the first semiconductor region and the second edge portion of the second semiconductor region are formed in the semiconductor region for ESD protection.

According to a fifth aspect, the semiconductor device having the ESD protection element of the fourth aspect is characterized in that the semiconductor region for ESD protection includes first and second partial semiconductor regions for ESD spaced from each other in an upper portion of the semiconductor substrate; and the first edge portion is formed in the first partial semiconductor region for ESD, and the second edge portion is formed in the second partial semiconductor region for ESD.

According to a sixth aspect, the semiconductor device having the ESD protection element of the fourth aspect further comprises a preliminary semiconductor region mainly composed of a specific material, interposed between the semiconductor substrate and the semiconductor region for ESD protection, the specific material containing a mixture of the first material and the second material.

According to a seventh aspect, a method of manufacturing a semiconductor device having an ESD protection element comprises the steps of: (a) preparing a semiconductor substrate of a first conductivity type mainly composed of a first material; (b) selectively forming a semiconductor region for ESD protection mainly composed of a second material, in an upper portion of the semiconductor substrate, the second material having a smaller breakdown field than the first material; and (c) forming first and second semiconductor regions of a second conductivity type independently of each other in a surface of the semiconductor substrate including the semiconductor region for ESD protection, the step (c) forming first and second edge portions opposed to each other in the semiconductor region for ESD protection, the first and second edge portion being edge portions of the first and second semiconductor regions, respectively.

According to an eighth aspect, the method of the seventh aspect is characterized in that: the step (b) includes performing an ion implantation of a specific material having a smaller breakdown field than the first material in an upper portion of the semiconductor substrate, to form the semiconductor region for ESD protection mainly composed of a mixture of the specific material and the first material; and the second material contain the mixture.

According to a ninth aspect of the present invention, in the method of the eighth aspect, the semiconductor region for ESD protection includes first and second partial semiconductor regions for ESD; the step (b) includes the steps of: (b-1) selectively forming a mask portion on the semiconductor substrate; and (b-2) performing an oblique ion implantation of the specific material from above the semiconductor substrate by using the mask portion as a mask, to form the first and second partial semiconductor regions for ESD spaced from each other so as to sandwich an underlying region of the mask region; and the step (c) includes performing a vertical ion implantation of an impurity of a second conductivity type from above the semiconductor substrate by using the mask portion as a mask, to form the first and second semiconductor regions, the first edge portion being formed in the first partial semiconductor region for ESD, the second edge portion being formed in the second partial semiconductor region for ESD.

According to a tenth aspect, in the method of the ninth aspect, step (b-1) includes the steps of: (b-1-1) selectively forming an insulating film on the semiconductor substrate; and (b-1-2) forming a gate electrode on the insulating film; and the mask portion includes the insulated film and the gate electrode.

According to an eleventh aspect, in the method of the seventh aspect, the second material contains a mixture of the first material and a specific material having a smaller breakdown field than the first material; and the step (b) includes the steps of: (b-1) forming a groove in an upper portion of the semiconductor substrate; and (b-2) forming the semiconductor region for ESD protection mainly composed of the second material in the groove by an epitaxial growth of the second material from the semiconductor substrate around the groove.

According to a twelfth aspect, in the method of the seventh aspect, the second material contains a material having a smaller breakdown field than the first material; and the step (b) includes the steps of: (b-1) forming a groove in an upper portion of the semiconductor substrate; (b-2) forming a preliminary semiconductor region mainly composed of a mixture of the first material and the second material along an inner periphery of the groove by an epitaxial growth of the mixture from the semiconductor substrate around the groove; and (b-3) forming a partial semiconductor region for ESD mainly composed of the second material in the groove including the preliminary semiconductor region by an epitaxial growth of the second material from the preliminary semiconductor region.

According to a thirteenth aspect, in the method of the seventh aspect, the step (c) includes the steps of: (c-1) selectively forming an insulating film on the semiconductor substrate; (c-2) forming a gate electrode on the insulating film; and (c-3) forming the first and second semiconductor regions in a surface of the semiconductor substrate by using portions including the gate electrode, as a mask.

According to a fourteenth aspect, the method of the seventh aspect further comprises step (d), between the steps (a) and (b), of forming an isolated insulating film, some of which projects from the semiconductor substrate, and the rest is buried in a surface of the semiconductor substrate, wherein the step (c) includes forming the first and second semiconductor regions in a surface of the semiconductor substrate by using the isolated insulating film as a mask.

In the semiconductor device having the ESD protection element of the first aspect, a semiconductor region for ESD protection is formed in the region of a semiconductor substrate including at least the region in the vicinity of the junction with the first and second edge portions opposed to each other in first and second semiconductor regions. The semiconductor region for ESD protection is mainly composed of a second material having a smaller breakdown field than a first material which is the principal constituent of the semiconductor substrate.

Therefore, when an ESD occurs and surge voltage is then applied to the first or second semiconductor region through an I/O terminal, the PN junction of the ESD protection element causes a breakdown to discharge the serge voltage, at a voltage lower than that in the case where the semiconductor region for ESD protection is mainly composed of the first material.

Accordingly, the temperature rise in the occurrence of an ESD is suppressed, leading to an ESD protection element that is resistant to thermal breakdown and excellent in ESD resistance.

An element for use in the normal operation can be formed without degrading its operation characteristics, by forming it in the semiconductor substrate mainly composed of the first material.

The semiconductor device having the ESD protection element of the second aspect has an insulating film formed on the semiconductor substrate between the first and second semiconductor regions, and a gate electrode formed on the insulating film. Thus, for instance, by connecting the first semiconductor region to an I/O terminal and setting the potential between the gate electrode and the second semiconductor region so as not to enter ON state in the normal state, it is possible to obtain an ESD protection element having the MOS transistor structure which causes no influence on another element connected to the I/O terminal in the normal state.

The semiconductor device having the ESD protection element of the third aspect has an isolated insulating region, some of which projects from the semiconductor substrate between the first and second semiconductor region, and the rest is buried in the surface of the semiconductor substrate. Thus, by connecting the first or second semiconductor region to an I/O terminal, it is possible to obtain an ESD protection element having the field transistor structure which always enters OFF state and causes no influence on another element connected to the I/O terminal in the normal state.

In the semiconductor device having the ESD protection element of the fourth aspect, a semiconductor region for ESD protection is selectively formed in the upper portion of a semiconductor substrate. Therefore, it is relatively easy to form an ESD protection element mainly composed of a second material which comprises a mixture of a first material and a specific material, by performing, for example, an ion implantation of the specific material having a smaller breakdown field than the first material, from above the semiconductor substrate.

In the semiconductor device having the ESD protection element of the fifth aspect, the semiconductor region for ESD protection includes a first partial semiconductor region for ESD wherein a first edge portion is present, and a second partial semiconductor region for ESD wherein a second edge portion is present. This enables to obtain an ESD protection element excellent in ESD resistance while minimizing the region for forming the semiconductor region for ESD protection.

The semiconductor device having the ESD protection element of the sixth aspect has a preliminary semiconductor region that is interposed between a semiconductor substrate and the semiconductor region for ESD protection, and is mainly composed of a specific material containing a mixture of first and second materials.

With this structure, it is possible to form a semiconductor region for ESD protection mainly composed of the second material by performing, for example, an epitaxial growth of a specific material (a mixture of the first and second materials) from above the semiconductor substrate, to form a preliminary semiconductor region mainly composed of the specific material, and then performing an epitaxial growth of the second material from the preliminary semiconductor region. This results in the semiconductor region for ESD protection mainly composed of the second material completely different from the first material. Thus, thanks to the semiconductor region for ESD protection mainly composed of the second material having a smaller breakdown field, it is possible to obtain an ESD protection element more excellent in ESD resistance.

In the method of manufacturing a semiconductor device having an ESD protection element according to the seventh aspect, in step (b) a semiconductor region for ESD protection mainly composed of a second material having a smaller breakdown voltage than a first material is selectively formed on the upper portion of a semiconductor substrate, and in step (c) the first and second semiconductor regions of a second conductivity type are formed in the surface of the semiconductor substrate including the semiconductor region for ESD protection. At the same time, first and second edge portions which are the edge portions of the first and second semiconductor regions and face with each other, are formed in the semiconductor region for ESD protection.

Therefore, even when an ESD occurs and a surge voltage is then applied to the first or second semiconductor region through an I/O terminal, the PN junction of the ESD protection element causes a breakdown to discharge the serge voltage, at a voltage lower than that in the case where the semiconductor region for ESD protection is mainly composed of the first material.

As a result, the temperature rise in the occurrence of an ESD is suppressed, leading to an ESD protection element that is resistant to thermal breakdown and excellent in ESD resistance.

In addition, an element for use in the normal operation can be formed without degrading its operation characteristics, by forming it in the semiconductor substrate mainly composed of the first material in other manufacturing step.

In the method of manufacturing a semiconductor device having an ESD protection element according to the eighth aspect, step (b) includes performing an ion implantation of a specific material having a smaller breakdown field than a first material in the upper portion of a semiconductor substrate, to form a semiconductor region for ESD protection mainly composed of a mixture of the first material and a specific material.

Thus, a semiconductor region for ESD protection mainly composed of a second material, which is a mixture of the specific material and the first material, can be obtained with a relatively simple ion implantation processing.

In the method of manufacturing an ESD protection element according to the ninth aspect, in step (b-2), by using a mask portion selectively formed on the semiconductor substrate as a mask, an oblique rotational ion implantation of a specific material is performed from above a semiconductor substrate, to form first and second partial semiconductor regions for ESD which are isolated by the underlying region of the mask portion.

This enables to obtain an ESD protection element excellent in ESD resistance while minimizing the region for forming the semiconductor region for ESD protection comprising the first and second partial semiconductor regions for ESD.

In the method of manufacturing an ESD protection element according to the tenth aspect, step (b-1) comprises step (b-1-1) of selectively forming an insulating film on a semiconductor substrate, and step (b-1-2) of forming a gate electrode on the insulating film, so that a mask portion includes the insulating film and the gate electrode.

Therefore, it is possible to obtain an ESD protection element having the MOS transistor structure by connecting, for example, a first semiconductor region to an I/O terminal and setting the potential between the gate electrode and a second semiconductor region so as not to enter ON state in the normal state.

In addition, since the insulating film and the gate electrode serve as a mask, the first and second partial semiconductor regions for ESD can be formed in the self alignment manner in the oblique rotational ion implantation of the specific material.

In the method of manufacturing a semiconductor device having an ESD protection element according to the eleventh aspect, in step (b-2) a second material that is a mixture of a first material and a specific material having a smaller breakdown field than the first material, is epitaxially grown from the semiconductor substrate around a groove so that a semiconductor region for ESD protection mainly composed of the second material is formed in the groove. Therefore, a semiconductor region for ESD protection mainly composed of the second material which is a mixture of the specific material and the first material can be obtained by employing epitaxial growth method.

In the method of manufacturing a semiconductor device having an ESD protection element according to the twelfth aspect, in step (b-2) a mixture of first and second materials is epitaxially grown from the semiconductor substrate to form a preliminary semiconductor region mainly composed of the mixture, and in step (b-3) the second material is epitaxially grown from the preliminary semiconductor region to form a partial semiconductor region for ESD mainly composed of the second material. This results in a semiconductor region for ESD protection mainly composed of the second material completely different from the first material. Therefore, thanks to the semiconductor region for ESD protection mainly composed of the second material having a smaller breakdown field, it is possible to obtain an ESD protection element more excellent in ESD resistance.

The method of manufacturing a semiconductor device having an ESD protection element according to the thirteenth aspect, step (c) includes step (c-1) of selectively forming an insulating film on a semiconductor substrate, step (c-2) of forming a gate electrode on the insulating film, and step (c-3) of forming first and second semiconductor regions on the surface of the semiconductor substrate by using the gate electrode as a mask. Therefore, it is possible to obtain an ESD protection element having the MOS transistor structure by connecting, for example, the first semiconductor region to an I/O terminal and setting the potential between the gate electrode and the second semiconductor region so as not to enter ON state in the normal state.

The method of manufacturing a semiconductor device having an ESD protection element according to the fourteenth aspect includes step (d), between steps (a) and (b), of forming an isolated insulating film, some of which projects from a semiconductor substrate, and the rest is buried in the semiconductor substrate. This permits an ESD protection element having the field transistor structure which always enters OFF state in the normal state by connecting, for example, the first semiconductor region to an I/O terminal.

Accordingly, an object of the present invention is to obtain a semiconductor device having an ESD protection element with an improved ESD resistance even when it is formed on a single substrate together with an internal circuit.

These and other objects, features, aspects and advantages of the present invention will become more apparent from the following detailed description of the present invention when taken in conjunction with the accompanying drawings.

DESCRIPTION OF THE PREFERRED EMBODIMENTS

Principle

Silicon (Si) substrates made of silicon are often employed as a semiconductor substrate. Meanwhile, the breakdown field of germanium (Ge) is 80 kV/cm, which is lower than that of Si, i.e., 300 kV/cm. Therefore, the formation of an ESD protection element in the region of Ge or silicon germanium (SiGe) may improve ESD resistance because its breakdown field is reduced compared to the formation in the region mainly composed of Si.

Specifically, a further improvement of ESD resistance than prior art can be expected by forming an ESD protection element in which opposed edge portions in the drain and source regions form a PN junction with the region of Ge or SiGe. This is because the field concentration occurs at these edge portions when a surge voltage is applied.

The region mainly composed of Ge or SiGe can be formed on an Si substrate by an ion implantation of Ge to the Si substrate, or by an epitaxial growth of SiGe (and Ge).

First Preferred Embodiment

Structure

Figure 1:
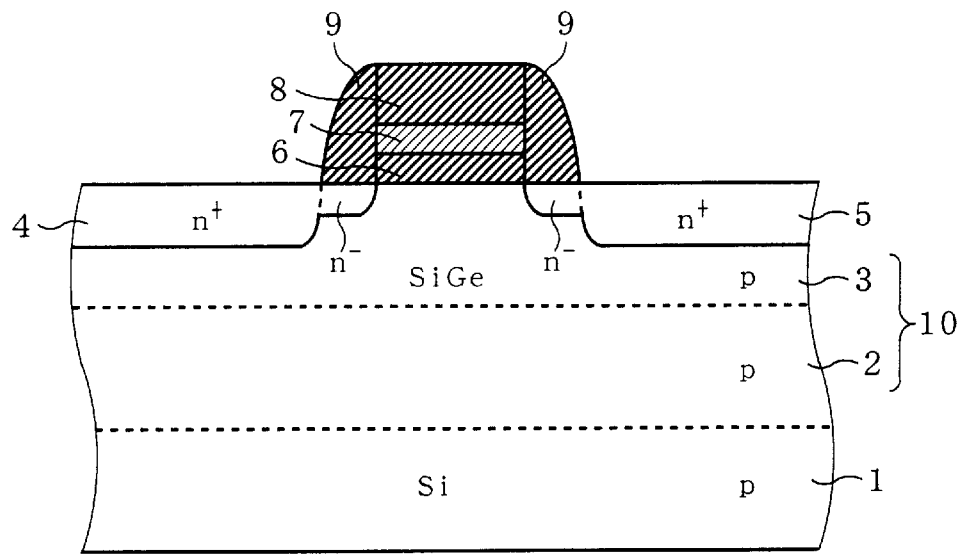
FIG. 1 is a cross-sectional view of the structure of an MOS transistor for protection according to a first preferred embodiment of the present invention.

FIG. 1 is a cross-sectional view showing the structure of an MOS transistor for protection according to a first preferred embodiment of the present invention. As shown in FIG. 1, a P well region 10 is selectively formed in the upper portion of a P type Si substrate 1 (in FIG. 1, the region 10 is formed in the enter surface, but in practice it is formed only on part of the upper portion of the Si substrate 1). The P well region 10 comprises as Si—P well region 2 mainly composed of Si, and an SiGe—P well region 3 mainly composed of SiGe. The SiGe—P well region 3 is formed on the Si—P well region 2.

A drain region 4 and a source region 5 are selectively formed in the surface of the SiGe—P well region 3. A gate oxide film 6 is formed on the SiGe—P well region 3 extending between the drain region 4 and the source region 5. A gate polysilicon layer 7 serving as a gate electrode is formed on the gate oxide film 6. An oxide film 8 is formed on the gate polysilicon layer 7. Sidewalls 9 are formed on the portions of the drain region 4 and the source region 5 adjacent to the gate oxide film 6, the gate polysilicon layer 7, and the oxide film 8.

This results in an MOS transistor for protection comprising the SiGe—P well region 3, the drain region 4, the source region 5, the gate oxide film 6, and the gate polysilicon layer 7. An MOS transistor for internal circuit (not shown) is also formed directly on the Si substrate 1, or formed in a well region mainly composed of Si. Therefore, the operation characteristics of the MOS transistor for internal circuit may not deteriorate.

Since the MOS transistor for protection having the above structure is formed on the SiGe region, the breakdown voltage of the junction between the source and drain is lower than that of the MOS transistor for internal circuit which is formed on the P type Si region.

Figure 2:
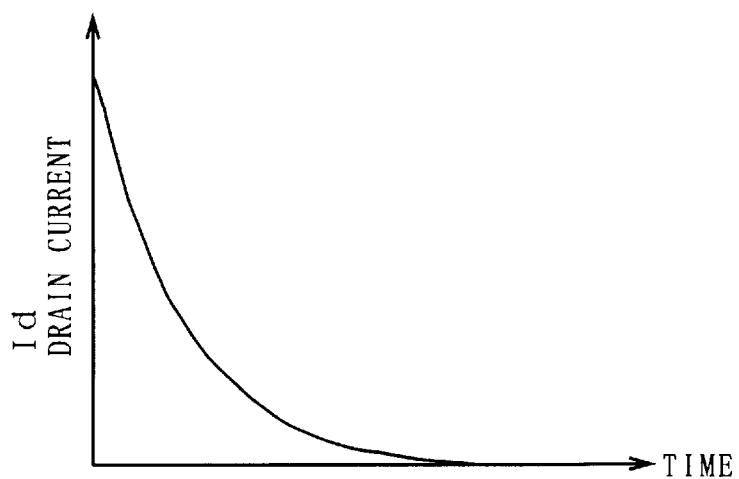
FIG. 2 is a graph showing the current changes with time when an MOS transistor for protection makes a discharge operation.

FIG. 2 is a graph showing the result of simulation of the discharge operation in an MOS transistor for protection when an ESD occurs. In FIG. 2, the drain current Id is plotted as ordinate and the time elapsed as abscissa. As can be seen from this graph, initially the drain current Id flows in large quantities, and thereafter, the quantity of the drain current Id is reduced with time.

Figure 3:
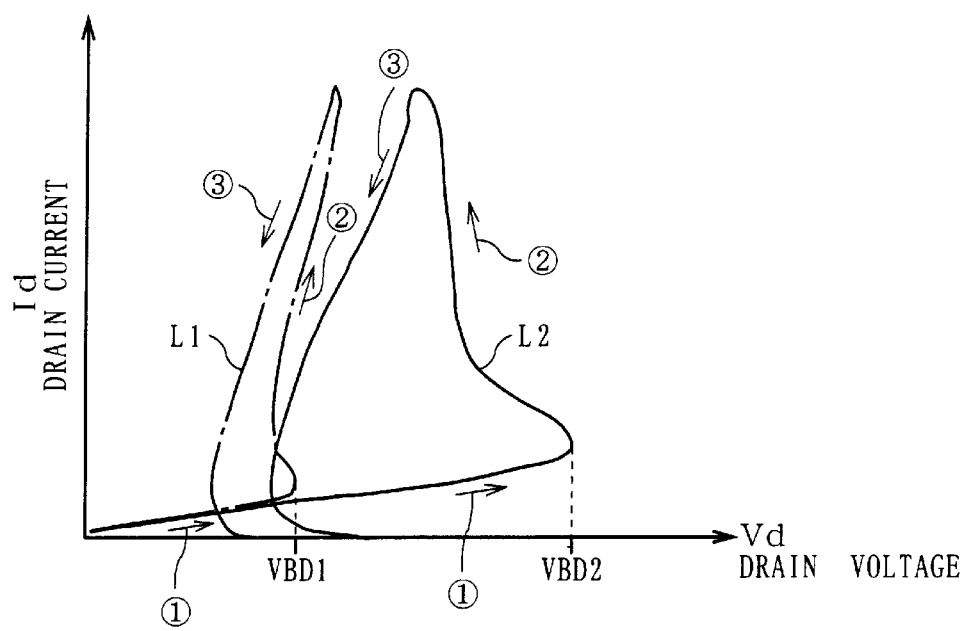
FIG. 3 is a graph showing the current and voltage changes when an MOS transistor for protection and an MOS transistor for internal circuit make a discharge operation, respectively.

FIG. 3 is a graph showing the results of simulations of both discharge operations in an MOS transistor for protection and an MOS transistor for internal circuit when an ESD occurs. In FIG. 3, the drain current Id is plotted as ordinate and the drain voltage Vd as abscissa, and L1 (broken line) indicates the result of the MOS transistor for protection, and L2 (solid line) indicates the result of the MOS transistor for internal circuit. Ideogram ① denotes the behavior until the MOS transistor for protection and the MOS transistor for internal circuit reach the breakdown voltage VBD1 and VBD2, respectively; ideogram ② denotes the behavior until a peak current flows after the breakdown; and ideogram ③ denotes the behavior after the peak current flows.

As can be seen from FIG. 3, the breakdown voltage VBD1 of the MOS transistor for protection is lower than the breakdown voltage VBD2 of the MOS transistor for internal circuit.

Figure 4:
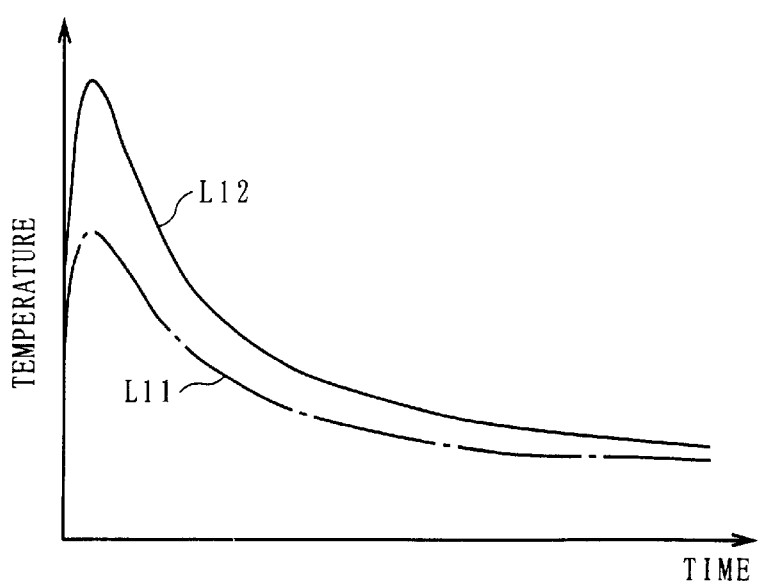
FIG. 4 is a graph showing the temperature changes with time when an MOS transistor for protection and an MOS transistor for internal circuit make a discharge operation, respectively.

FIG. 4 is a graph showing the temperature changes with time during the operations of the MOS transistor for protection and the MOS transistor for internal circuit shown in FIG. 3. In the graph of FIG. 4, the temperature is plotted as ordinate and the time elapsed as abscissa, and L11 (broken line) indicates the result of the MOS transistor for protection, and L12 (solid line) indicates the result of the MOS transistor for internal circuit.

As can be seen from FIG. 4, the breakdown voltage VBD1 of the MOS transistor for protection is lower than the breakdown voltage VBD2 of the MOS transistor for internal circuit, and therefore, the rise of the temperature is retarded in the former. That is, compared to the MOS transistor for internal circuit, the MOS transistor for protection is resistant to thermal breakdown and suppresses the temperature rise more satisfactorily, thus permitting the improvement of ESD resistance.

As described, in the first preferred embodiment the drain region 4 and the source region 5 of the MOS transistor for protection is formed in the SiGe—P well region 3 (i.e., a semiconductor region for ESD protection) formed in the upper portion of the Si substrate 1. It is therefore possible to obtain a favorable ESD resistance without degrading the performance of the MOS transistor for internal circuit.

Manufacturing Method

FIGS. 5 to 8 are a cross-sectional view illustrating a manufacturing step in a method of manufacturing the MOS transistor for protection shown in FIG. 1, according to the first preferred embodiment. Its manufacturing steps will be described hereafter by referring to these figures.

Figure 5:
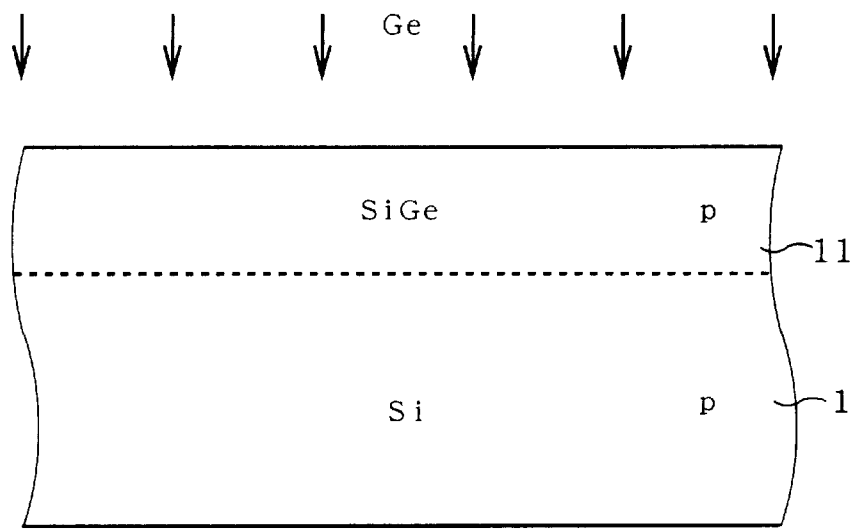
FIG. 5 is a cross-sectional view illustrating a manufacturing step in a method of manufacturing an MOS transistor for protection according to the first preferred embodiment.

Referring to FIG. 5, an ion implantation of Ge is conducted to an Si substrate 1 at an energy of 100 KeV and a dosage of $1 \times 10^{14} cm^{-2}$, to from an SiGe layer 11 mainly composed of SiGe in the upper portion of the Si substrate 1. Here, the energy is set so that the SiGe layer 11 is thicker than the source and drain regions of the ultimately formed MOS transistor. Also, the dosage is set so that the MOS transistor to be formed on the SiGe layer 11 has a breakdown voltage lower than that of the MOS transistor to be formed on the Si substrate 1 or a well region of Si.

Figure 6:
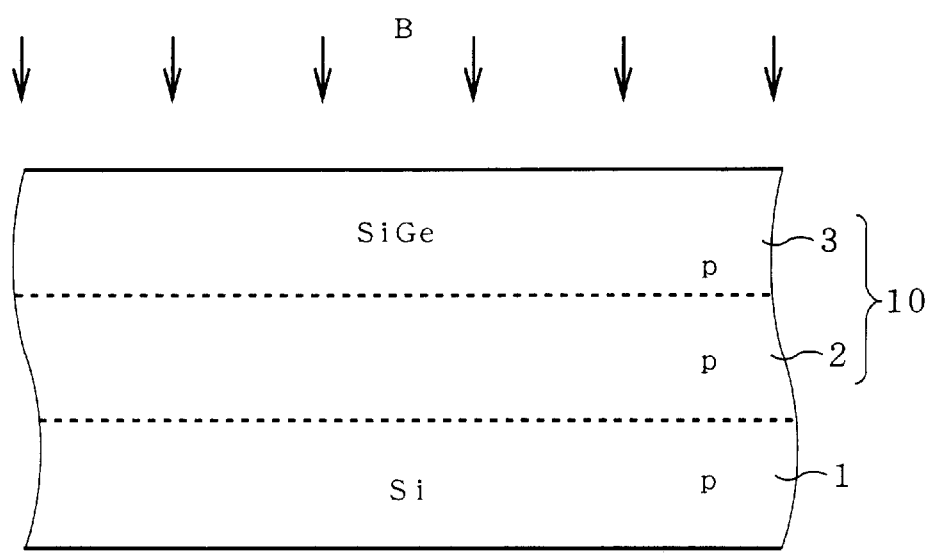
FIG. 6 is a cross-sectional view illustrating another manufacturing step in the method of the first preferred embodiment.

Referring to FIG. 6, an ion implantation of boron (B) (i.e., a first ion implantation) is conducted at an energy of 120 KeV and a dosage of $1 \times 10^{12} cm^{-2}$, and another ion implantation of boron (B) (i.e., a second ion implantation) is conducted at an energy of 70 KeV and a dosage of $1 \times 10^{13} cm^{-2}$, to form a P well region 10. In the P well region 10, the region mainly composed of Si becomes an Si—P well region 2 and the region mainly composed of SiGe becomes an SiGe—P well region 3.

The main object of the first ion implantation is to increase the P type impurity concentration of the under portion of the P well region 10, in order to prevent the punch through phenomenon of the MOS transistor. The object of the second ion implantation is to increase the P type impurity concentration of the upper portion of the P well region 10, in order to adjust the threshold voltage.

Figure 7:
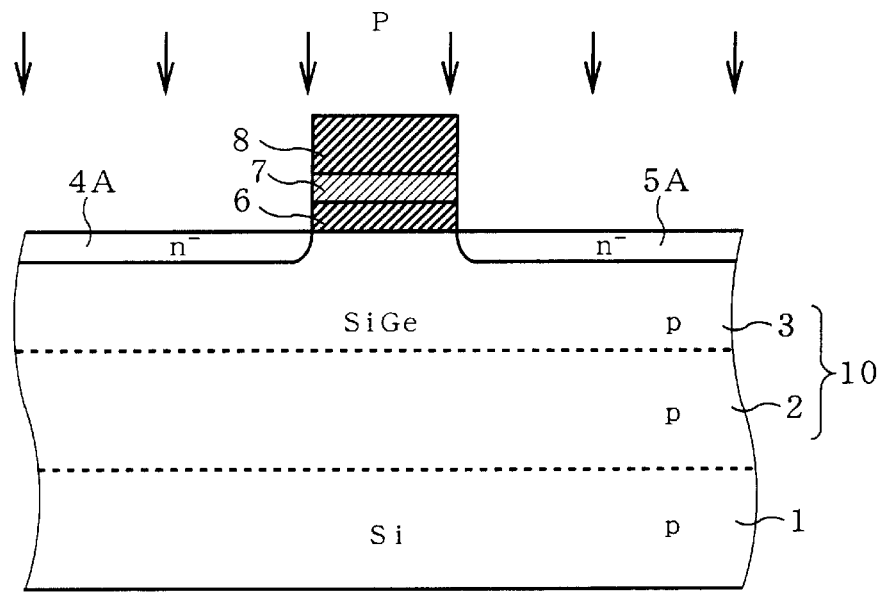
FIG. 7 is a cross-sectional view illustrating another manufacturing step in the method of the first preferred embodiment.

Referring to FIG. 7, a gate oxide film 6 is selectively formed on the SiGe—P well region 3, and a gate polysilicon layer 7 serving as a gate electrode is formed on the gate oxide film 6. After forming an oxide film over the entire surface, only the oxide film on the gate polysilicon layer 7 is left to obtain an oxide film 8. By using the oxide film 8 (the gate oxide film 6, the gate polysilicon film 7) as a mask, an ion implantation of phosphorus (P) is conducted at an energy of 30 KeV and a dosage of $2 \times 10^{13} cm^{-2}$, to form a drain region 4A and a source region 5A in the surface of the SiGe—P well region 3.

Figure 8:
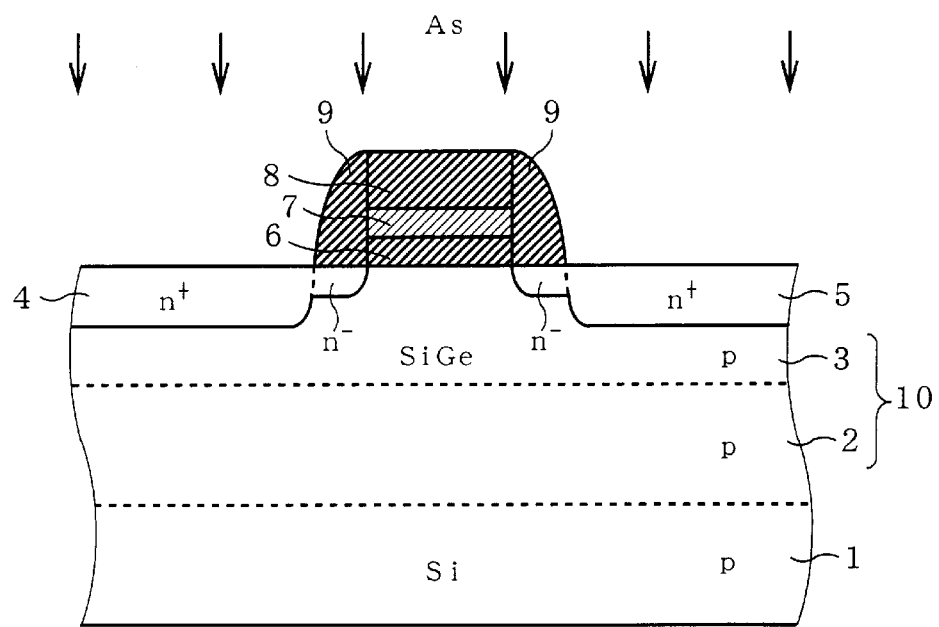
FIG. 8 is a cross-sectional view illustrating another manufacturing step in the method of the first preferred embodiment.

Referring to FIG. 8, sidewalls 9 composed of an oxide film are formed on the sides of the gate oxide film 6, the gate polysilicon layer 7, and the oxide film 8. Then, by using the oxide film 8 and the sidewalls 9 as a mask, an ion implantation of arsenic (As) is conducted at an energy of 30 KeV and a dosage of $1\times10^{15}\mathrm{cm}^{-2}$, and a heat treatment is performed at 820° C. for 15 minutes, so that a drain region 4 and a source region 5 are formed by double diffusion, resulting in the MOS transistor for protection having the structure shown in FIG. 1.

Thus, the MOS transistor for protection excellent in ESD resistance can be formed on the Si substrate 1 by means of ion implantation.

Second Preferred Embodiment

Structure

Figure 9:
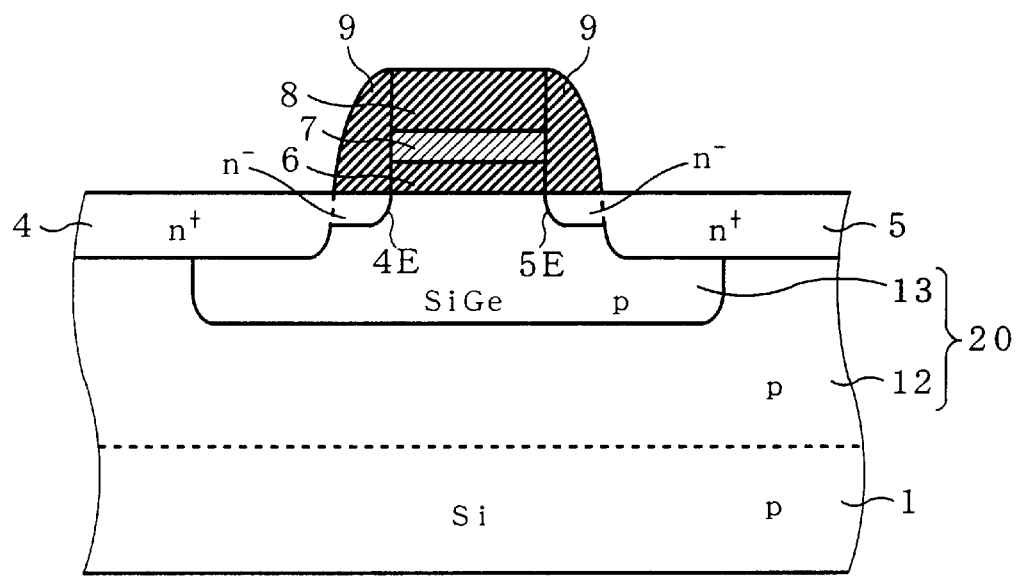
FIG. 9 is a cross-sectional view illustrating a manufacturing step in a method of manufacturing an MOS transistor for protection according to a second preferred embodiment of the present invention.

FIG. 9 is a cross-sectional view showing the structure of an MOS transistor for protection according to a second preferred embodiment of the present invention. As shown in FIG. 9, a P well region 20 is selectively formed in the upper portion of a P type Si substrate 1 (in FIG. 9, the region 20 is formed in the enter surface, but in practice it is formed only in part of the upper portion of the Si substrate 1). The P well region 20 comprises an Si—P well region 12 mainly composed of Si, and an SiGe—P well region 13 mainly composed of SiGe. The SiGe—P well region 13 is buried in the upper portion of the Si—P well region 12.

A drain region 4 and a source region 5 are selectively formed in the surfaces of the Si—P well region 12 and the SiGe—P well region 13. At the same time, edge portions 4E and 5E in the drain region 4 and the source region 5 opposed to each other, respectively, are formed in the SiGe—P well region 13.

Then, a gate oxide film 6 is formed on the SiGe—P well region 13 extending between the drain region 4 and the source region 5. A gate polysilicon layer 7 serving as a gate electrode is formed on the gate oxide film 6. An oxide film 8 is formed on the gate polysilicon layer 7. Sidewalls 9 are formed on the portions of the drain region 4 and the source region 5 adjacent to the gate oxide film 6, the gate polysilicon layer 7, and the oxide film 8.

This results in an MOS transistor for protection comprising the SiGe—P well region 13, the drain region 4, the source region 5, the gate oxide film 6, and the gate polysilicon layer 7. An MOS transistor for internal circuit (not shown) is also formed in a region mainly composed of Si, such as the Si substrate 1.

As described, in the MOS transistor for protection of the second preferred embodiment, the edge portions 4E, 5E in the drain and source regions 4 and 5 opposed to each other, respectively, are present in the SiGe—P well region 13 (a semiconductor region for ESD protection). Therefore, like the first preferred embodiment, a favorable ESD resistance can be obtained without degrading the performance of the MOS transistor for internal circuit.

Manufacturing Method

FIGS. 10 to 13 are a cross-sectional view illustrating a manufacturing step in a method of manufacturing the MOS transistor for protection shown in FIG. 9, according to the second preferred embodiment. Its manufacturing steps will be described hereafter by referring to these figures.

Figure 10:
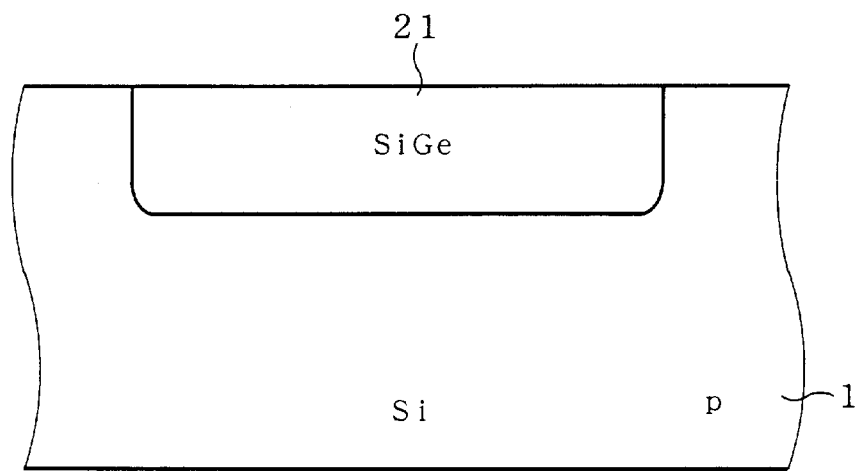
FIG. 10 is a cross-sectional view illustrating another manufacturing step in the method of the second preferred embodiment.

Referring to FIG. 10, the upper portion of an Si substrate 1 is selectively etched to form a groove, and SiGe is epitaxially grown from the Si substrate 1 extending around a groove, so that an SiGe layer 21 mainly composed of SiGe is formed in the groove. As an epitaxial growth method, there are an MBE (molecular beam epitaxy) method and a CVD (chemical vapor deposition), and the like.

Figure 11:
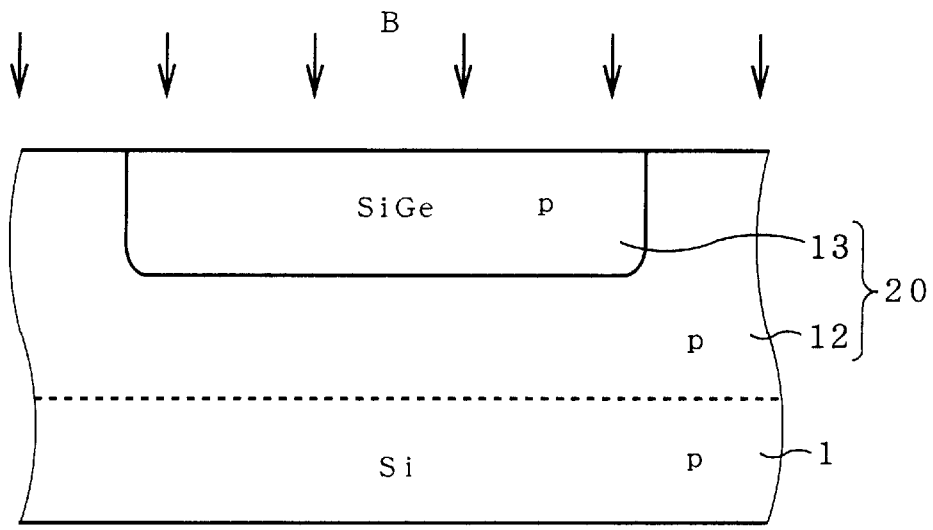
FIG. 11 is a cross-sectional illustrating another manufacturing step in the method of the second preferred embodiment.

Referring to FIG. 11, like the manufacturing step of FIG. 6 in the manufacturing method of the first preferred embodiment, an ion implantation of boron is conducted two times to form a P well region 20. In the P well region 20, the region mainly composed of Si (i.e., the Si substrate 1) becomes an Si—P well region 12, and the region mainly composed of SiGe (i.e., an SiGe layer 21) becomes an SiGe—P well region 13.

Figure 12:
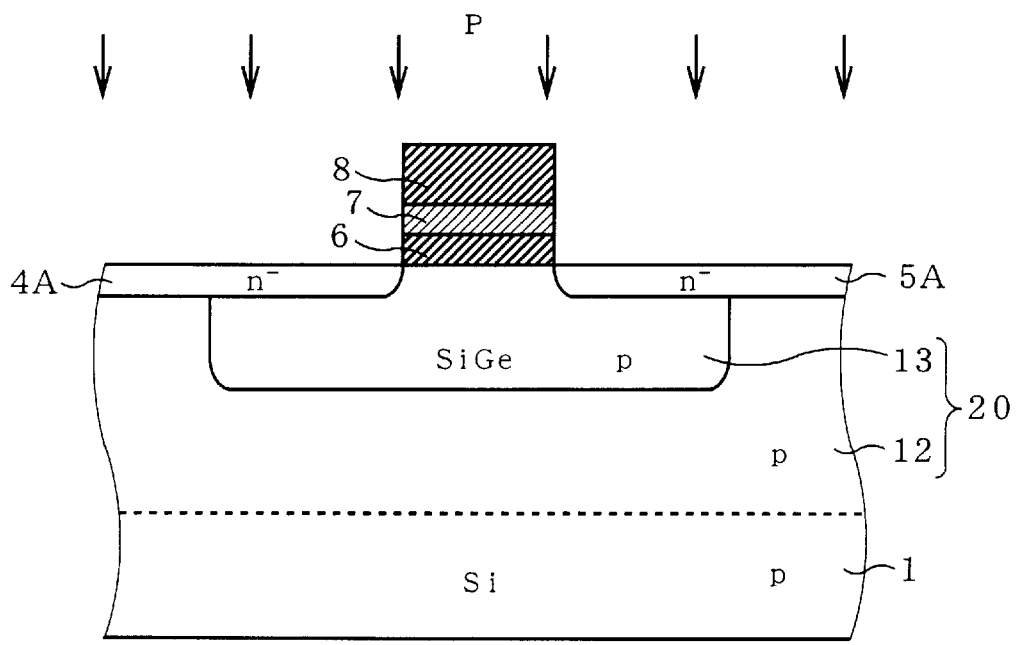
FIG. 12 is a cross-sectional view illustrating another manufacturing step in the method of the second preferred embodiment.
Figures 13, 14:
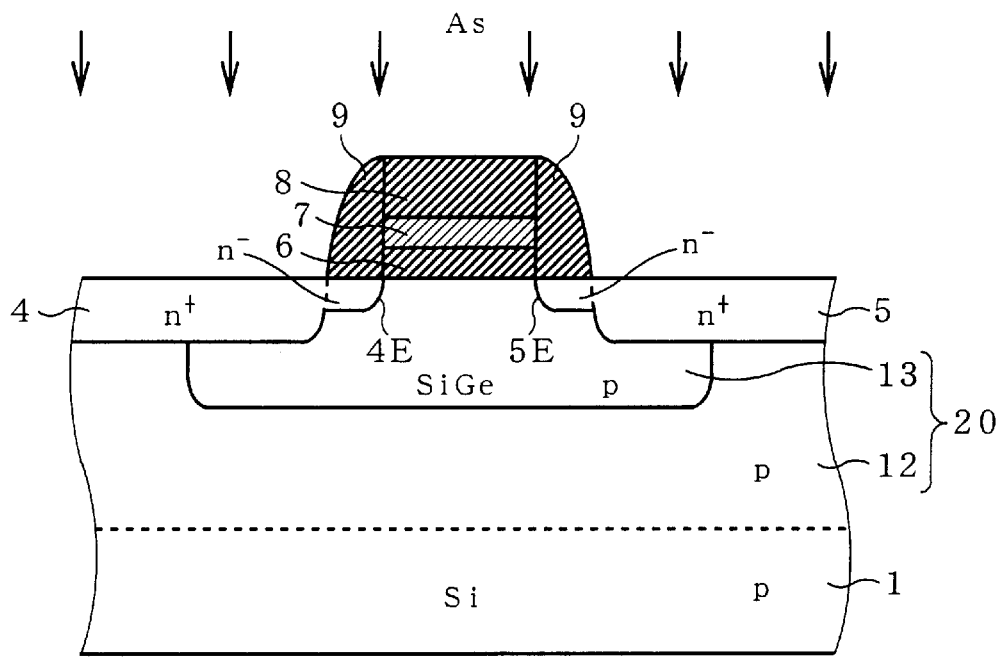
FIG. 13 is a cross-sectional view illustrating another manufacturing step in the method of the second preferred embodiment.
FIG. 14 is a cross-sectional view illustrating an example of a modified MOS transistor for protection of the second preferred embodiment.

Referring to FIGS. 12 and 13, the same manufacturing steps as shown in FIGS. 7 and 8 are carried out to obtain an MOS transistor for protection of the second preferred embodiment.

EXAMPLES OF MODIFICATION

Structure

FIG. 14 is a cross-sectional view of a modified MOS transistor for protection of the second preferred embodiment. As shown in FIG. 14, a P well region 16 is formed in the upper portion of an Si substrate 1. The P well region 16 comprises an Si—P well region 12 mainly composed of Si, an SiGe region 14 mainly composed of SiGe, and a Ge—P well region 15 mainly composed of Ge. The Ge—P well region 15 is buried in the upper portion of the Si—P well region 12 through the SiGe region 14.

A drain region 4 and a source region 5 are selectively formed in the surfaces of the Si—P well region 12, the SiGe region 14, and the Ge—P well region 15. At the same time, edge portions 4E and 5E in the drain and source region 4 and 5, opposed to each other, respectively, are formed in the Ge—P well region 15. Other structural features of this modified transistor are the same as those shown in FIG. 9.

As described, in the above modified MOS transistor for protection in the second preferred embodiment, the opposed edge portions 4E and 5E of the drain and source regions 4 and 5, respectively, are present in the Ge—P well region 15 mainly composed of Ge. This permits a higher ESD resistance than that of the structure shown in FIG. 9, because the principal constituent of that region is Ge instead of SiGe.

Manufacturing Method

The manufacturing method of the above modified MOS transistor for protection shown in FIG. 14 is described hereafter.

After a groove is formed by selectively etching the upper portion of an Si substrate 1, SiGe is epitaxially grown from the Si substrate 1 extending around the groove, so that an SiGe region mainly composed of SiGe is formed along the inner periphery of the groove.

Thereafter, Ge is epitaxially grown from the SiGe region, so that a Ge-Well region is formed in the groove including the SiGe region.

Then, like the manufacturing step shown in FIG. 11, an ion implantation of boron is conducted two times to form a P well region 16. In the P well region 16, the region mainly composed of Si (i.e., the Si substrate 1) becomes and Si—P well region 12, the region mainly composed of SiGe becomes an SiGe region 14, and the region mainly composed of Ge becomes a Ge—P well region 15.

The same manufacturing steps as shown in FIG. 12 and 13 are carried out to obtain a modified MOS transistor for protection in the second preferred embodiment.

Third Preferred Embodiment

Structure

Figure 15:
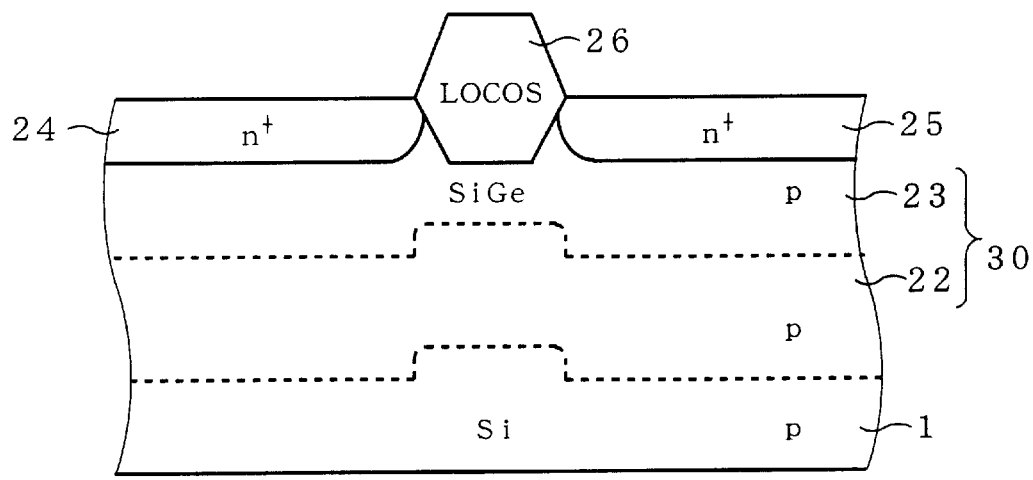
FIG. 15 is a cross-sectional view of the structure illustrating a field transistor for protection according to a third preferred embodiment of the present invention.

FIG. 15 is a cross-sectional view showing the structure of a field transistor for protection according to a third preferred embodiment of the present invention. As shown in FIG. 15, a P well region 30 is selectively formed in the upper portion of a P type Si substrate 1 (in FIG. 15, the region 30 is formed in the enter surface, but in practice it is formed only on part of the upper portion of the Si substrate 1). The P well region 30 comprises an Si—P well region 22 mainly composed of Si, and an SiGe—P well region 23 mainly composed of SiGe. The SiGe—P well region 23 is formed on the Si—P well region 22.

There is formed an LOCOS oxide film 26, some of which is buried in the surface of the SiGe—P well region 23, and the rest projects from the surface of the SiGe—P well region 23.

A drain region 24 and a source region 25 are formed so as to sandwich the LOCOS oxide film 26 in the surface of the SiGe—P well region 23.

This results in a field transistor for protection which comprises the SiGe—P well region 23, the drain region 24, the source region 25, and the LOCOS oxide film 26. Also, a field transistor fir internal circuit (not shown) is formed directly on the Si substrate 1.

In the field transistor for protection having the above structure according to the third preferred embodiments, the drain region 4 and the source region 5 are formed in the SiGe—P well region 23 (a semiconductor region for ESD protection). Therefore, a favorable ESD resistance can be obtained without degrading the performance of the field transistor for internal circuit.

Manufacturing Method

FIGS. 16 to 19 are a cross-sectional view illustrating a manufacturing step in a method of manufacturing the field transistor for protection shown in FIG. 15, according to the third preferred embodiment. Its manufacturing steps will be described hereafter by referring to these figures.

Figure 16:
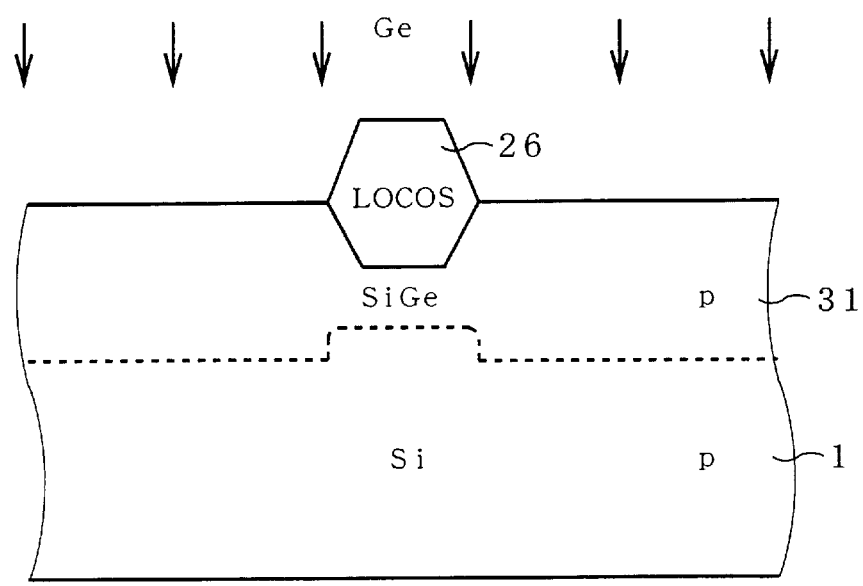
FIG. 16 is a cross-sectional view illustrating a manufacturing step in a method of manufacturing a field transistor for protection according to the third preferred embodiment.

Referring to FIG. 16, by an LOCOS method, an LOCOS film 26 having a thickness of 4000 Å is formed, some of which is buried in the surface of an Si substrate 1, and the rest projects from the surface of the Si substrate 1. Then, an ion implantation of Ge is conducted to the Si substrate 1 at an energy of 100 KeV and a dosage of $1 \times 10^{14} \text{cm}^{-2}$, so that an SiGe layer 31 mainly composed of SiGe is formed in the upper portion of the Si substrate 1. Here, the energy is set so that the SiGe layer 31 is thicker than the source and drain regions of the ultimately formed field transistor. Also, the dosage is set so that the breakdown voltage of the field transistor to be formed on the SiGe layer 31 is satisfactorily lower than that of the transistor to be directly formed on the Si substrate 1.

Figure 17:
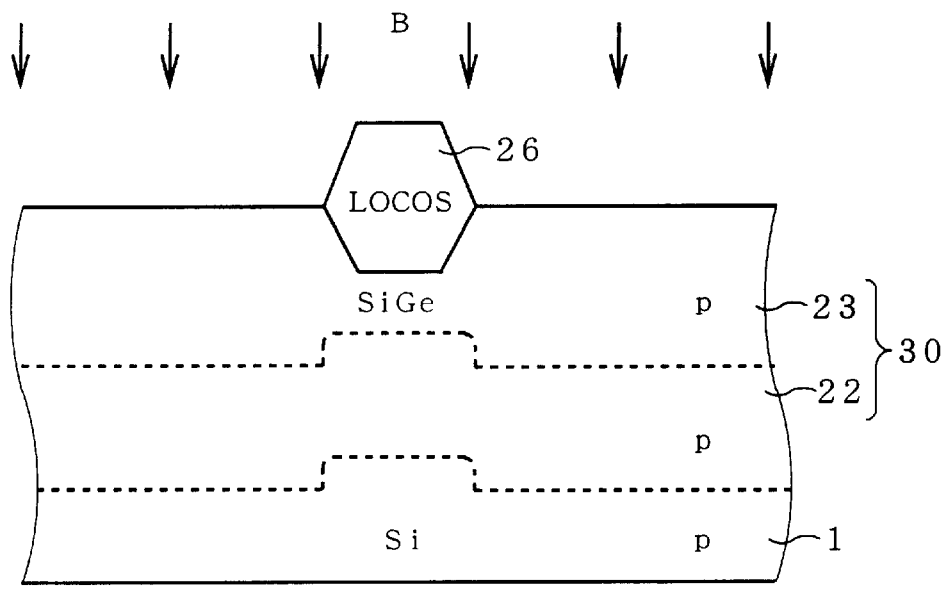
FIG. 17 is a cross-sectional view illustrating another manufacturing step in the method of the third preferred embodiment.

Referring to FIG. 17, an ion implantation of boron (B) is conducted at an energy of 120 KeV and a dosage of $1 \times 10^{12} \text{cm}^{-2}$, and another ion implantation of boron is conducted at an energy of 70 KeV and a dosage of $1 \times 10^{13} \text{cm}^{-2}$, to form a P well region 30. In the P well region 30, the region mainly composed of Si becomes an Si—P well region 22, and the region mainly composed of SiGe becomes an SiGe—P well region 23. The object of the former ion implantation is to prevent the punch through phenomenon of the field transistor, and that of the latter is to adjust the threshold voltage, as in the first preferred embodiment.

Figure 18:
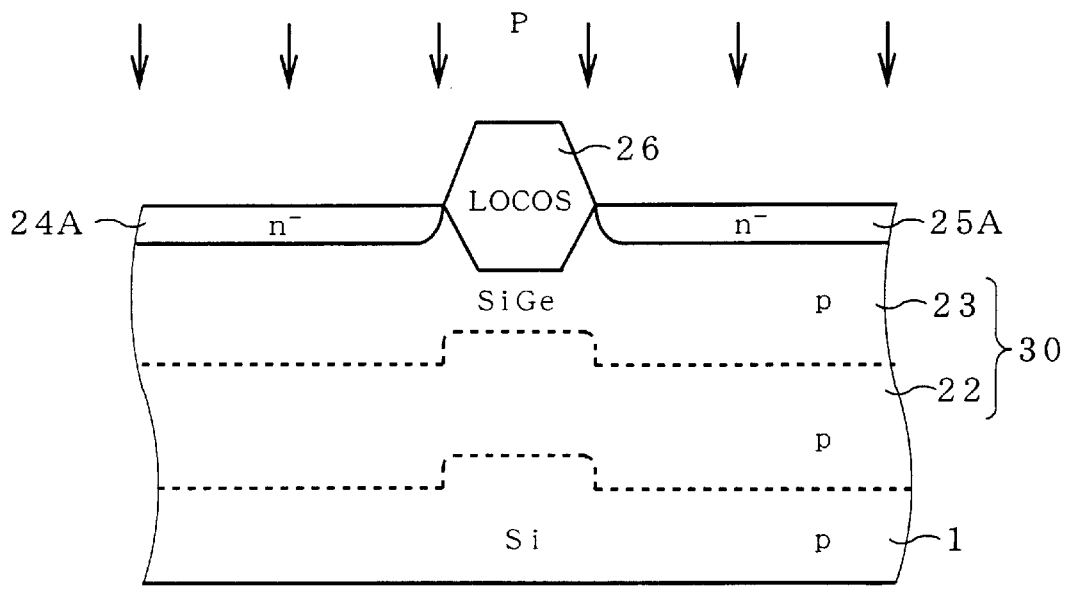
FIG. 18 is a cross-sectional view illustrating another manufacturing step in the method of the third preferred embodiment.

Referring to FIG. 18, by using a LOCOS oxide film 26 as a mask, an ion implantation of phosphorus (P) is conducted at an energy of 30 KeV and a dosage of $2 \times 10^{13} \text{cm}^{-2}$, so that a drain region 24A and a source region 25A are formed in the surface of the SiGe—P well region 23. Since an LOCOS oxide film 26 is thick, the phosphorus (P) may not reach the SiGe—P well region 23 underlying the LOCOS oxide film 26.

Figure 19:
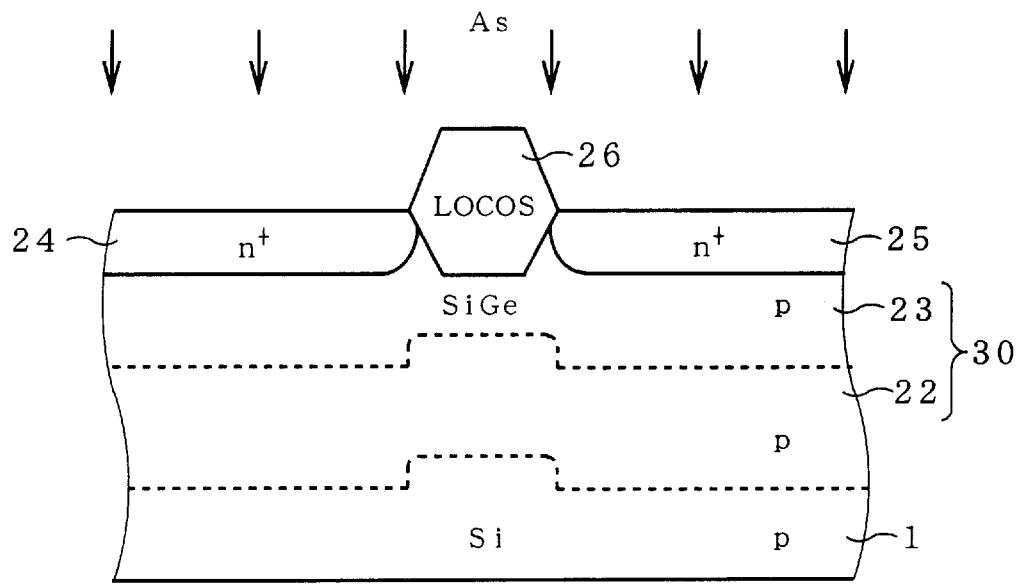
FIG. 19 is a cross-sectional view illustrating another manufacturing step in the method of the third preferred embodiment.

Referring to FIG. 19, an ion implantation of arsenic (As) is conducted at an energy of 30 KeV and a dosage of $1 \times 10^{15} \text{cm}^{-2}$, and a heat treatment is performed at 820° C. for 15 minutes, so that a drain region 24 and a source region 25 are formed by double diffusion, resulting in the field transistor for protection shown in FIG. 15.

Thus, the field transistor for protection excellent in ESD resistance can be formed on the Si substrate 1 by means of ion implantation.

Fourth Preferred Embodiment

Structure

Figure 20:
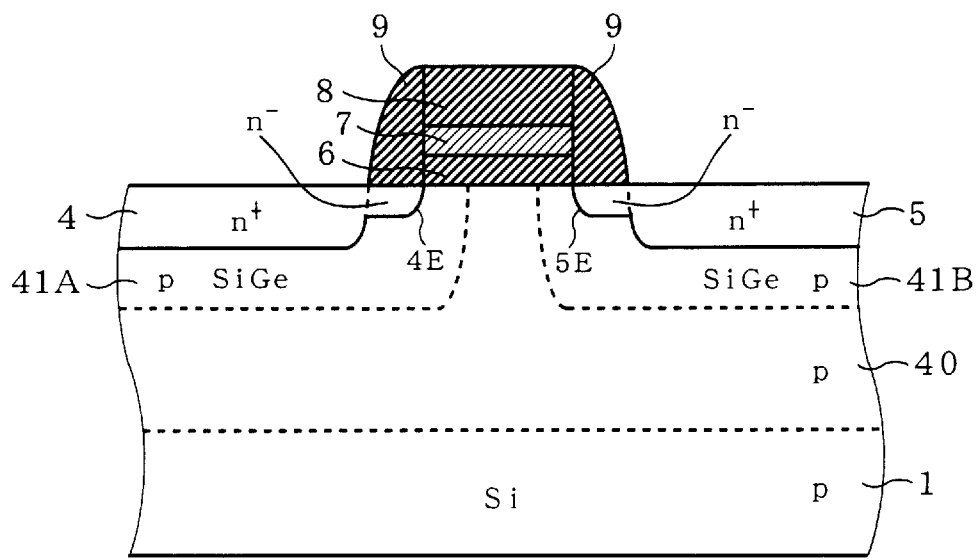
FIG. 20 is a cross-sectional view of the structure of an MOS transistor for protection according to a fourth preferred embodiment of the present invention.

FIG. 20 is a cross-sectional view showing the structure of an MOS transistor for protection according to a fourth preferred embodiment of the present invention. As shown in FIG. 20, a P well region 40 is selectively formed in the upper portion of a P type Si substrate 1 (in FIG. 20, the region 40 is formed in the enter surface, but in practice it is formed only on part of the upper portion of the Si substrate 1). SiGe—P well regions 41A, 41B are formed apart in the upper portions of the P well region 40.

A drain region 4 is selectively formed in the surface of the SiGe—P well region 41A, and a source region 5 is selectively formed in the surface of the SiGe—P well region 41B. A gate oxide film 6 is formed in the P well region 40 (including the SiGe—P well regions 41A, 41B) extending between the drain region 4 and the source region 5. A gate polysilicon layer 7 serving as a gate electrode is formed on the gate oxide film 6. An oxide film 8 is formed on the gate polysilicon layer 7. Sidewalls 9 are formed on the portions of the drain region 4 and the source region 5 adjacent to the gate oxide film 6, the gate polysilicon layer 7, and the oxide film 8.

This results in an MOS transistor for protection which comprises the P well region 40 (including the SiGe—P well regions 41A, 41B), the drain region 4, the source region 5, the gate oxide film 6, and the gate polysilicon layer 7. Also, an MOS transistor for internal circuit (not shown) is formed directly on the Si substrate 1.

In the MOS transistor for protection having the above structure of the fourth preferred embodiment, the drain region 4 and the source region 5 are formed in the SiGe—P well regions 41A and 41B mainly composed of SiGe (a semiconductor region for ESD protection), respectively. Therefore, the breakdown voltage of the junction between the source and drain is lower than that of the MOS transistor for internal circuit which is formed in a region mainly composed of a P type Si.

Thus, like the first and second preferred embodiments, the MOS transistor for protection of the fourth preferred embodiment permits a favorable ESD resistance without degrading the performance of the MOS transistor for internal circuit.

In addition, the region mainly composed of SiGe is minimized because the edge portion 4E of the drain region 4 and the edge portion 5E of the source region 5 are present in the SiGe—P well region 41A and the SiGe—P well region 41B, respectively.

Manufacturing Method

FIGS. 21 to 24 are a cross-sectional view illustrating a manufacturing step in a method of manufacturing the MOS transistor for protection shown in FIG. 20, according to the fourth preferred embodiment. Its manufacturing steps will be described hereafter by referring to these figures.

Figure 21:
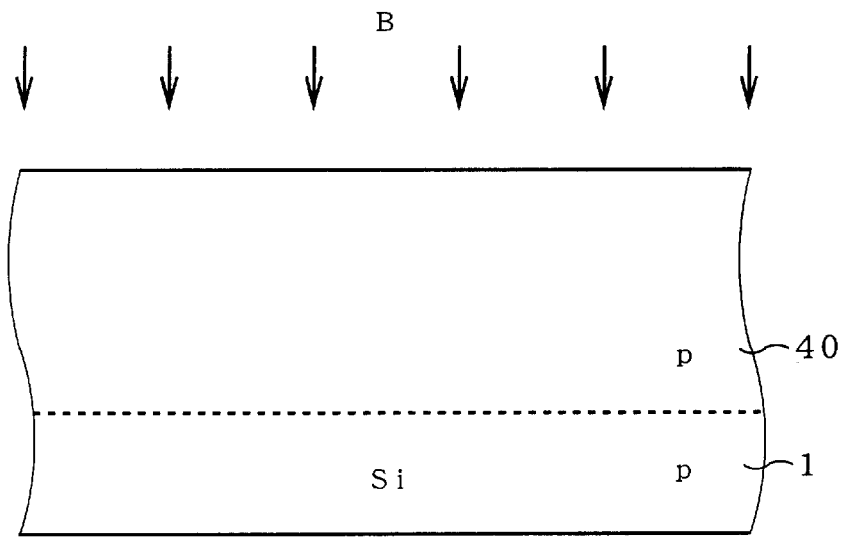
FIG. 21 is a cross-sectional view illustrating a manufacturing step in a method of manufacturing an MOS transistor for protection according to the fourth preferred embodiment.

Referring to FIG. 21, an ion implantation of boron (B) (i.e., a first ion implantation) is conducted at an energy of 120 KeV and a dosage of $1 \times 10^{12} \text{cm}^{-2}$, and another ion implantation of boron (B) (i.e., a second ion implantation) is conducted at an energy of 70 KeV and a dosage of $1 \times 10^{13} \text{cm}^{-2}$, to form a P well region 40.

The main object of the first ion implantation is to increase the P type impurity concentration of the under portion of the P well region 40, in order to prevent the punch through phenomenon of the MOS transistor. The object of the second ion implantation is to increase the P type impurity concentration of the upper portion of the P well region 40, in order to adjust the threshold voltage.

Figure 22:
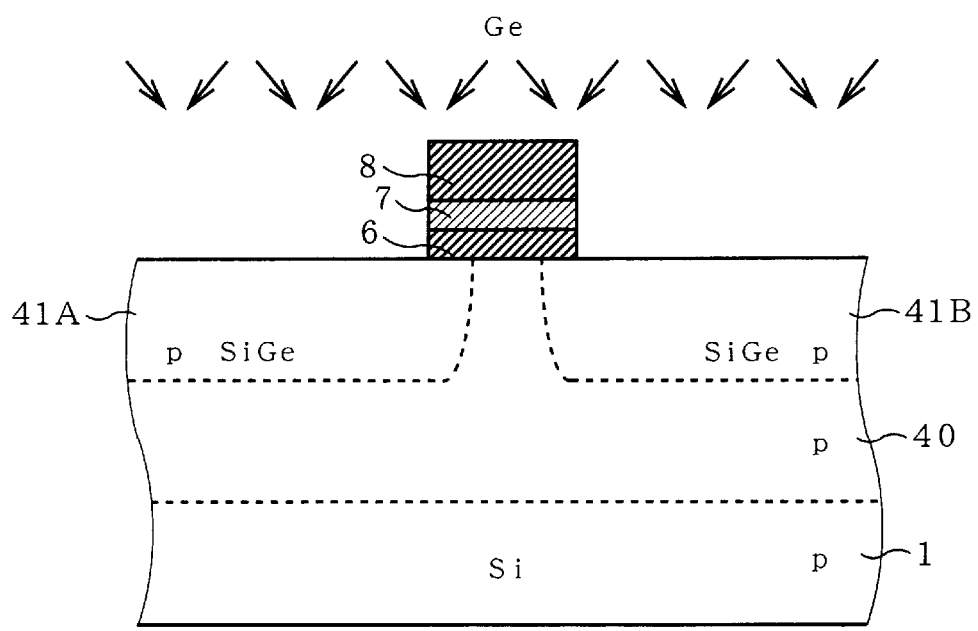
FIG. 22 is a cross-sectional view illustrating another manufacturing step in the method of the fourth preferred embodiment.

Referring to FIG. 22, a gate oxide film 6 is selectively formed on the P well region 40, and a gate polysilicon layer 7 serving as a gate electrode is formed on the gate oxide film 6. After forming an oxide film over the entire surface, only the oxide film on the gate polysilicon layer 7 is left to obtain an oxide film 8. An oblique rotational ion implantation of Ge is conducted from above to the P well region 40 at an energy of 100 KeV and a dosage of $1\times10^{14}\text{cm}^{-2}$, so that SiGe—P well regions 41A, 41B are formed in the upper portions of the P well region 40. This results in the SiGe—P well regions 41A and 41B, part of which underlies the gate oxide film 6.

Here, the energy is set so tat the SiGe—P well regions 41A, 41B are thicker than the source and drain regions of the ultimately formed MOS transistor. Also, the dosage is set so that the breakdown voltage of the MOS transistor whose drain and source will be formed in the SiGe—P well regions 41A and 41B, respectively, is satisfactorily lower than that of the MOS transistor whose drain and source will be directly formed on the Si substrate 1.

Figure 23:
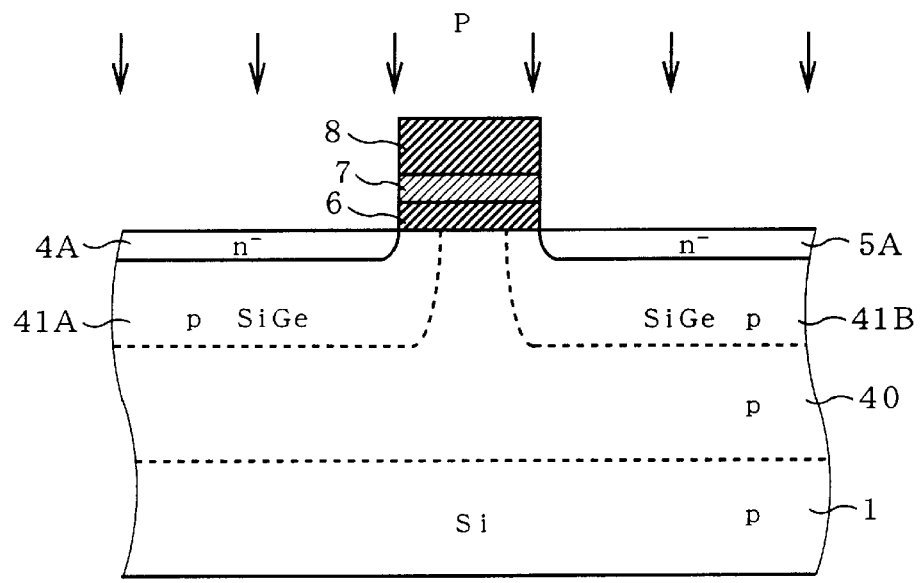
FIG. 23 is a cross-sectional view illustrating another manufacturing step in the method of the fourth preferred embodiment.

Referring to FIG. 23, by using an oxide film 8 as a mask, a vertical ion implantation of phosphorus (P) is conducted from above at an energy of 30 KeV and a dosage of $2\times10^{13}\text{cm}^{-2}$, so that a drain region 4A and a source region 5A are formed in the surfaces of the SiGe—P well regions 41A and 41B, respectively.

Figure 24:
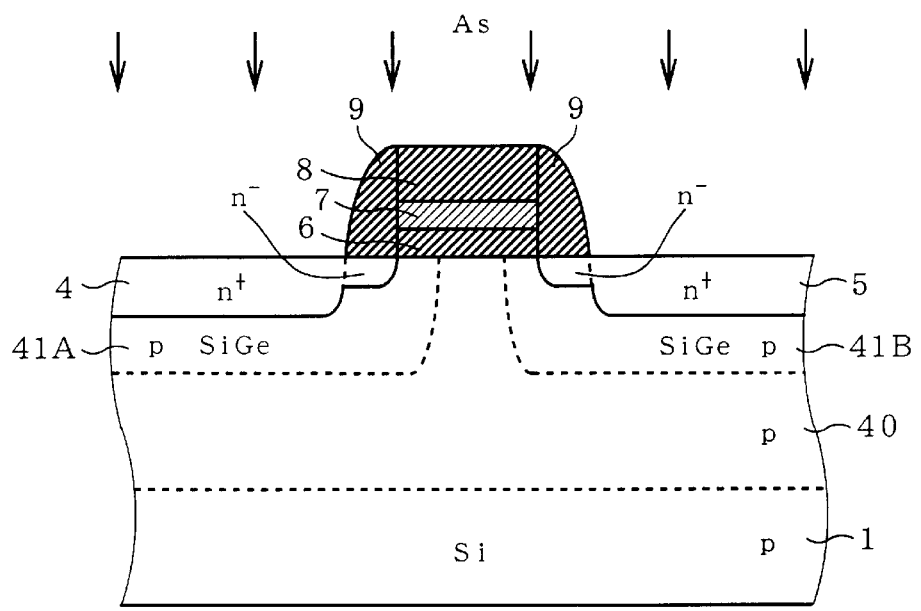
FIG. 24 is a cross-sectional view illustrating another manufacturing step in the method of the fourth preferred embodiment.
Figure 25:
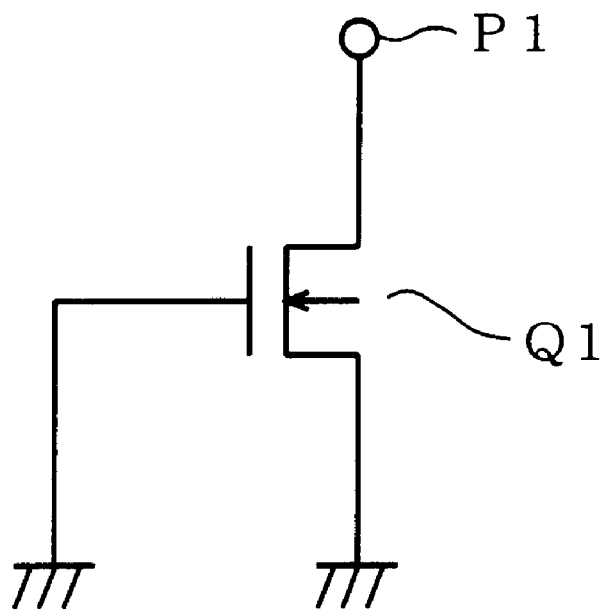
FIG. 25 is a circuit diagram showing a configuration of a conventional MOS transistor for protection.

Referring to FIG. 24, sidewalls 9 comprising an oxide film are formed on the sides of the gate oxide film 6, the gate polysilicon layer 7, and the oxide film 8. Then, by using the oxide film 8 and the sidewalls 9 as a mask, a vertical ion implantation of arsenic (As) is conducted from above at an energy of 30 KeV and a dosage of $1\times10^{15}\text{cm}^{-2}$, and a heat treatment is performed at 820° C. for 15 minutes, so that a drain region 4 and a source region 5 are formed by double diffusion, resulting in the MOS transistor for protection having the structure shown in FIG. 20.

Thus, the MOS transistor for protection excellent in ESD resistance can be formed on the Si substrate 1 by means of ion implantation.

Others

Although the foregoing preferred embodiments demonstrate the cases where a semiconductor region for ESD protection composed of SiGe or Ge is formed on a Si substrate, the present invention is, of course, applicable to any kind of ESD protection elements with the above mentioned structure, having a semiconductor region for ESD protection which is formed by a second material having a smaller breakdown field than a first material that is the principal constituent of the substrate.

While the invention has been shown and described in detail, the foregoing description is in all aspects illustrative and not resistive. It is therefore understood that numerous modifications and variations can be devised without departing from the scope of the invention.

I claim:

1. A semiconductor device having an electrostatic discharge (ESD) protection element comprising:

a semiconductor substrate of a first conductivity type and comprised mainly of a first material;

a first semiconductor region of a second conductivity type formed in a surface of said semiconductor substrate and extending below said surface;

a second semiconductor region formed in a surface of said semiconductor substrate independently of said first semiconductor region and extending below said surface, wherein said first and second semiconductor regions have first and second edge portions below said surface that are opposed to each other; and a semiconductor region for ESD protection of said first conductivity type formed in a region of said semiconductor substrate so as to provide a junction with at least a part of said first and second edge portions, said semiconductor region for ESD protection being comprised mainly of a second material having a smaller breakdown field than said first material and having a portion lying below said first and second edge portions.

2. The semiconductor device having the ESD protection element of claim 1 further comprising:

an insulting film on said semiconductor substrate between said first and second semiconductor regions; and a gate electrode on said insulating film.

3. The semiconductor device having the ESD protection element of claim 1 further comprising an isolated insulating region having a portion which projects from said semiconductor substrate between said first and second semiconductor regions and a portion buried in said surface of said semiconductor substrate.

4. The semiconductor device having the ESD protection element of claim 1 wherein, said semiconductor region for ESD protection is selectively formed in an upper portion of said semiconductor substrate; and said first edge portion of said first semiconductor region and said second edge portion of said second semiconductor region are fully formed in said semiconductor region for ESD protection.

5. The semiconductor device having the ESD protection element of claim 4 wherein, said semiconductor region for ESD protection includes first and second partial semiconductor regions for ESD spaced from each other in an upper portion of said semiconductor substrate; and said first edge portion is fully formed in said first partial semiconductor region for ESD, and said second edge portion is fully formed in said second partial semiconductor region for ESD.

6. The semiconductor device having the ESD protection element of claim 1 wherein said first material contain silicon (Si) and said second material contain silicon germanium (SiGe).

7. The semiconductor device having the ESD protection element of claim 4 further comprising a preliminary semiconductor region comprised mainly of a specific material, interposed between and semiconductor substrate and said semiconductor region for ESD protection, said specific material containing a mixture of said first material and said second material.

8. The semiconductor device having the ESD protection element of claim 7 wherein said first material contains silicon (Si), said second material contains germanium (Ge), and said specific material contains silicon germanium (SiGe).

* * * * *